United States Patent
Skinner et al.

(10) Patent No.: US 6,720,756 B2
(45) Date of Patent: Apr. 13, 2004

(54) MODIFYING ACOUSTIC EMISSIONS OF FANS

(75) Inventors: Harry G. Skinner, Beaverton, OR (US); Duane G. Quiet, Hillsboro, OR (US); Willem M. Beltman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/991,619

(22) Filed: Nov. 5, 2001

(65) Prior Publication Data

US 2003/0086223 A1 May 8, 2003

(51) Int. Cl.[7] .............................................. G01N 27/00
(52) U.S. Cl. .................................................. 324/71.1
(58) Field of Search .......................... 324/71.1, 76.41, 324/76.13, 76.11; 318/599, 461

(56) References Cited

U.S. PATENT DOCUMENTS

| | | | | |
|---|---|---|---|---|
| 4,588,934 A | * | 5/1986 | Suzuki et al. | 318/449 |
| 4,856,078 A | | 8/1989 | Konopka | 388/831 |
| 5,511,127 A | * | 4/1996 | Warnaka | 381/71.5 |
| 5,777,897 A | | 7/1998 | Giorgio | 364/557 |
| 5,825,972 A | | 10/1998 | Brown | 388/811 |
| 6,010,310 A | | 1/2000 | MacBeth | 417/44.1 |
| 6,182,902 B1 | | 2/2001 | Shih | 236/35 |
| 6,247,898 B1 | * | 6/2001 | Henderson et al. | 417/3 |
| 6,249,099 B1 | | 6/2001 | Nessi et al. | 318/439 |
| 6,276,900 B1 | | 8/2001 | Lyszkowski et al. | 417/2 |
| 6,433,507 B1 | * | 8/2002 | Makaran et al. | 318/811 |

* cited by examiner

*Primary Examiner*—N. Le
*Assistant Examiner*—John Teresinski
(74) *Attorney, Agent, or Firm*—Seth Z. Kalson

(57) ABSTRACT

In one embodiment to reduce unwanted acoustic fan noise, the control signal for a computer system cooling fan is modulated so that the acoustic noise power spectral density of the fan has a bandwidth greater than when the control signal is constant.

9 Claims, 3 Drawing Sheets

MODIFYING ACOUSTIC EMISSIONS OF FANS

FIELD

Embodiments of the present invention relate to fan speed control, and more specifically, to controlling the fan so that it is perceived as quieter.

BACKGROUND

Illustrated in FIG. 1 is a portion of a computer system comprising central processing unit (CPU) 102, chipset 104, graphics card 106, and memory 108. Chipset 104 allows for communication between CPU 102, memory 108, and graphics card 106, as well as other peripheral components (not shown) connected to system bus 110. One or more of these system components may generate an appreciable amount of heat, so that fan 112 is employed to cool part or all of the computer system. Usually, CPU 102 generates the most heat, and for some computer systems, more than one fan may be employed.

Customers of computer systems, both in the home and in business, often prefer computer systems with quiet fans. As a result, many original equipment manufacturers are sensitive to the acoustic noise generated by fans. One approach to reducing fan noise is to adjust the fan speed according to measured temperature, as shown in FIG. 1. Heat sensor 112 provides to fan voltage controller 114 a signal indicative of temperature. Heat sensor 112 may be placed near CPU 102, for example, and may be integrated with CPU 102. Fan voltage controller 114 provides a fan control voltage to fan 112 so as to adjust the speed of fan 112. When heat sensor 112 indicates that maximum cooling is needed, the fan control voltage is increased to its maximum nominal value so that fan 112 circulates sufficient air flow for cooling. When maximum cooling is not required, fan voltage controller 114 lowers the fan control voltage supplied to fan 112 so that the speed of fan 112 is reduced, along with the accompanying acoustic noise. Fan voltage controller 114 may even cause fan 112 to stand idle.

The combination of sensor 112, fan voltage controller 114, and fan 112 comprises a closed feedback loop so that the computer system of FIG. 1 is sufficiently cooled, so that the acoustic noise generated by fan 112 is reduced when CPU 102 is not operating at its maximum workload. However, the acoustic noise reduction scheme of FIG. 1 does not provide a reduction in acoustic noise when CPU 102 is operating at its maximum workload.

DESCRIPTION OF EMBODIMENTS

Embodiments of the present invention provide a time varying fan control voltage so as to spread the acoustic noise power spectral density generated by the fan over a larger bandwidth than when compared to the case in which the fan control voltage is constant over appreciable periods of time.

Figure 1:
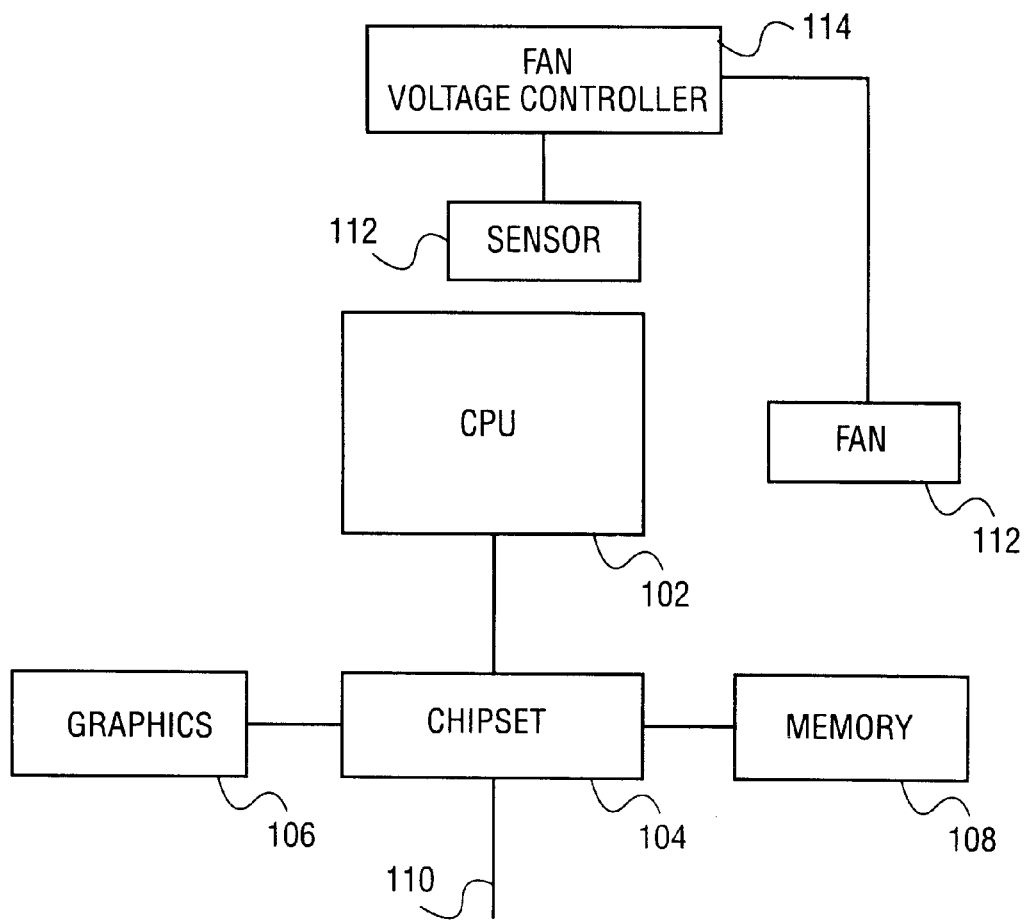
FIG. 1 is a prior art computer system with a closed loop feedback for fan speed control.
Figure 2:
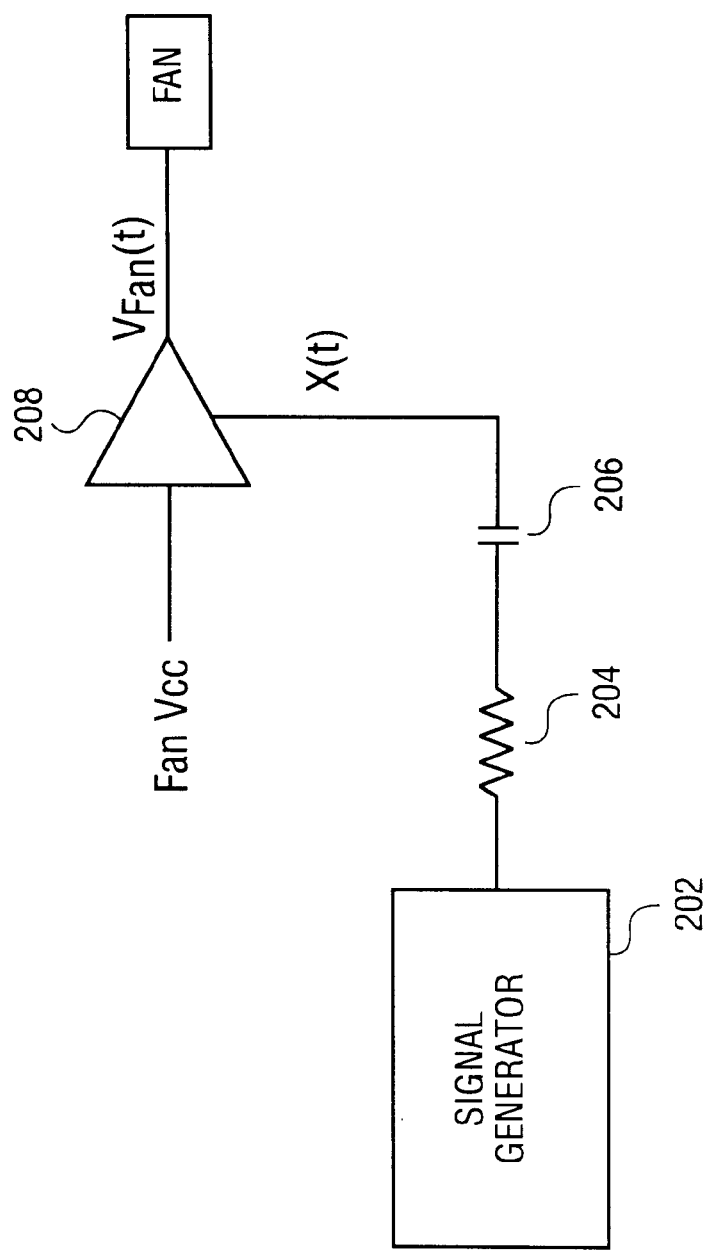
FIG. 2 is an embodiment of the present invention.

FIG. 2 provides an embodiment. Signal generator 202 provides a signal, which is filtered by a highpass filter comprising resistor 204 and capacitor 206, so as to provide a modulating signal X(t) to modulator 208. Modulator 208 modulates a supply voltage $V_{CC}$ in response to the modulating signal X(t) to provide a modulated fan control voltage, denoted as $V_{FAN}(t)$.

Figure 3B:
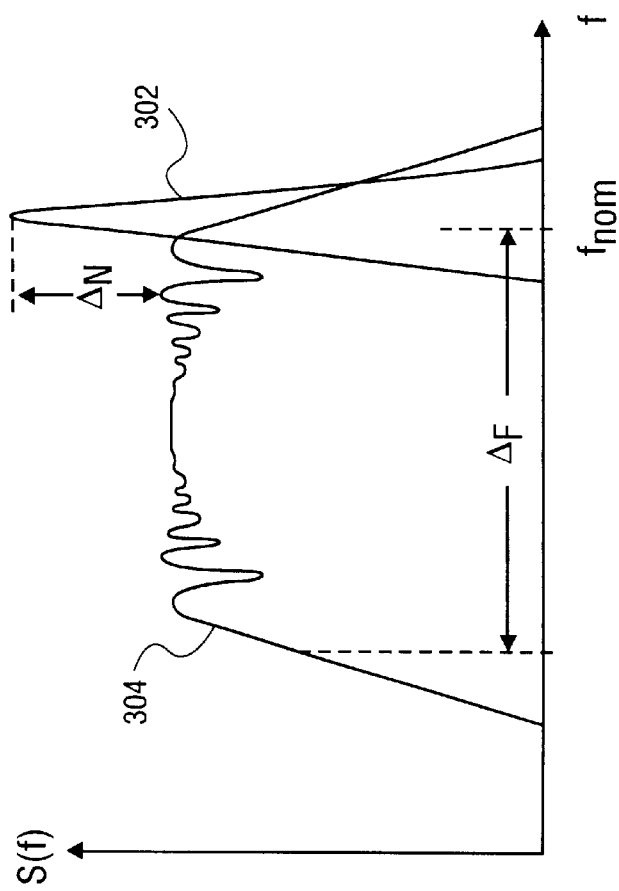
FIG. 3B illustrates a noise power spectral density for constant fan control voltage and a noise power spectral density for the modulated fan control voltage illustrated in FIG. 3A.
Figure 3A:
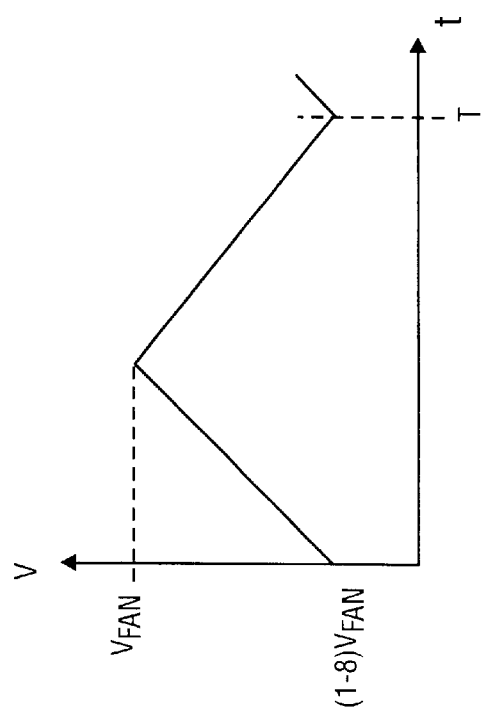
FIG. 3A illustrates a fan control voltage according to an embodiment of the present invention.

An example of $V_{FAN}(t)$ is shown in FIG. 3A, where for simplicity only one period of $V_{FAN}(t)$ is shown, with a period denoted by T. In this example, $V_{FAN}(t)$ is a triangular waveform, but many other types of waveforms may be employed. In the embodiment of FIG. 3A, the maximum of $V_{FAN}(t)$ is simply denoted by $V_{FAN}$, and the minimum is denoted as $(1-\delta)V_{FAN}$, where $\delta$ is a positive number less than one. For one embodiment, a 3 dB (50%) reduction in perceived acoustic noise power has been measured for a modulation frequency of 10 Hz (T=0.1 sec) and an amplitude modulation of 5% ($\delta$=0.05). This 3 dB reduction in measured acoustic noise power is due to the spreading of the noise power spectral density into frequencies not readily perceived as noise by a human listener.

In other embodiments, the modulated fan control voltage waveform may be obtained from a pseudo random sequence, or a random sequence. For some embodiments, signal generator 202 may be realized by a functional unit within chipset 110. Modulator 208 may be realized in a number of ways. For example, if X(t) is a periodic signal, then modulator 208 may be a simple summer or multiplier so that X(t) is added to or multiplied by $V_{CC}$ to provide the modulated fan control voltage $V_{FAN}(t)$.

FIG. 3B provides an example of spreading the acoustic noise power spectral density by the modulated voltage waveform of FIG. 3A. Curve 302 is the acoustic noise power spectral density for a constant fan control voltage $V_{FAN}(t) = V_{FAN}$. Curve 302 is seen to be relatively sharply peaked about some nominal acoustic frequency, denoted as $f_{NOM}$. Curve 304 is the acoustic noise power spectral density for the modulated fan control voltage $V_{FAN}(t)$ of FIG. 3A. The bandwidth of curve 304 is denoted as $\Delta_F$, which is seen to be larger than the bandwidth of curve 302. To first order, $\Delta_F$ may be approximated as $\Delta_F \sim \alpha \delta f_{NOM}$, where $\alpha$ is a positive scalar. However, for many systems, the relationship between bandwidth spreading and modulation factor $\delta$ may be more complicated. The maximum (peak) of curve 304 is less than the maximum of curve 302, where the difference is denoted as $\Delta_N$.

Noise having the power spectral density of curve 304 may be perceived by a human observer as less noisy than a noise source having the power spectral density of curve 302. By modulating the fan voltage, the frequency content of the acoustic noise power spectral density is spread into frequencies that may be perceived as less noisy by a human listener. Even if voltage modulation does not change the total noise power (area under the spectral density curve), the peak of the power spectral density will decrease just to maintain the same area under the curves. In general, there may be a decrease in total noise power due to voltage modulation, which contributes to a lower peak power spectral density, but the majority of the decrease in peak power spectral density is due to spreading of the power spectral density. Consequently, it is observed in the described embodiments that fan voltage modulation reduces the noise power spectral density for frequencies considered "noisy" by an observer.

Furthermore, it may not be necessary for the peak of the power spectral density for a modulated control voltage to be less than the peak of the power spectral density for a constant control voltage, provided the spectral peak for a modulated control voltage occurs at a sufficiently lower frequency than $f_{NOM}$. This is due to human perception, where a lower frequency noise may be perceived as less annoying than a higher frequency noise. However, for the embodiment represented by FIGS. 3A and 3B, the power spectral density for the modulated fan is everywhere lower than that for the constant control voltage case.

Various modifications may be made to the disclosed embodiments without departing from the scope of the invention as claimed below. For example, if fan speed is responsive to supply current, then supply current to the fan may be modulated so that the noise power spectral density has the desired characteristics as described above for the embodiments with modulated control voltage.

What is claimed is:

1. An apparatus comprising:
   a fan having a fan speed responsive to a control signal, the fan generating acoustic noise in response to the control signal, the acoustic noise having a power spectral density; and
   a modulator to provide the control signal such that the power spectral density has a greater bandwidth than when the fan is operating under a constant control signal;
   wherein the modulator provides the control signal such that the control signal is periodic with period T, the period T having a first time interval $T_1$ and a second time interval $T_2$ where $T=T_1+T_2$, and wherein the control signal is increasing over the first time interval and is decreasing over the second time interval.

2. The apparatus as set forth in claim 1, wherein the modulator provides the control signal such that the $T_1+T_2$.

3. The apparatus as set forth in claim 1, wherein the modulator provides the control signal such that the control signal is a triangular waveform.

4. A computer system comprising:
   a fan to exchange air in the computer system, the fan having a fan speed responsive to a control signal, the fan generating acoustic noise in response to the control signal, the acoustic noise having a power spectral density; and
   a modulator to provide the control signal such that the power spectral density has a greater bandwidth than when the fan is operating under a constant control signal;
   wherein the modulator provides the control signal such that the control signal is periodic with period T, the period T having a first time interval $T_1$ and a second time interval $T_2$ where $T=T_1+T_2$, and wherein the control signal is increasing over the first time interval and is decreasing over the second time interval.

5. The computer system as set forth in claim 4, wherein the modulator provides the control signal such that the $T_1=T_2$.

6. The computer system as set forth in claim 4, wherein the modulator provides the control signal such that the control signal is a triangular waveform.

7. A method to modify noise from a fan, the fan having a fan speed responsive to a control signal, the method comprising:
   providing a time varying control signal to the fan such that the noise has a power spectral density having a larger bandwidth than when the fan is operating under a constant control signal;
   wherein the control signal is periodic with period T, the period T having a first time interval $T_1$ and a second time interval $T_2$ where $T=T_1+T_2$, and wherein the control signal is increasing over the first time interval and is decreasing over the second time interval.

8. The method as set forth in claim 7, wherein the modulator provides the control signal such that $T_1=T_2$.

9. The method as set forth in claim 7, wherein the modulator provides the control signal such that the control signal is a triangular waveform.

* * * * *

UNITED STATES PATENT AND TRADEMARK OFFICE
CERTIFICATE OF CORRECTION

PATENT NO. : 6,720,756 B2 Page 1 of 1
DATED : April 13, 2004
INVENTOR(S) : Skinner et al.

It is certified that error appears in the above-identified patent and that said Letters Patent is hereby corrected as shown below:

<u>Column 3,</u>
Line 34, delete "+" and insert -- = --.

Signed and Sealed this

Tenth Day of August, 2004

JON W. DUDAS
*Acting Director of the United States Patent and Trademark Office*